United States Patent
Cho et al.

(10) Patent No.: US 9,735,053 B2
(45) Date of Patent: Aug. 15, 2017

(54) SOURCE DRIVING INTEGRATED CIRCUITS INCLUDING AN ELECTROSTATIC DISCHARGE CIRCUIT AND RELATED LAYOUT METHOD

(71) Applicant: SAMSUNG ELECTRONICS CO., LTD., Suwon-si (KR)

(72) Inventors: Young-Jin Cho, Osan-si (KR);
Hong-Yeon Kim, Incheon (KR);
Youn-Ho Hwang, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 664 days.

(21) Appl. No.: 14/231,921

(22) Filed: Apr. 1, 2014

(65) Prior Publication Data
US 2014/0301001 A1 Oct. 9, 2014

(30) Foreign Application Priority Data

Apr. 4, 2013 (KR) .................. 10-2013-0037038

(51) Int. Cl.
*H01L 21/768* (2006.01)
*H02H 9/04* (2006.01)
*H01L 27/02* (2006.01)

(52) U.S. Cl.
CPC .... *H01L 21/76895* (2013.01); *H01L 27/0255* (2013.01); *H01L 27/0296* (2013.01); *H02H 9/046* (2013.01)

(58) Field of Classification Search
CPC ............. H01L 21/76895; H01L 21/768; H01L 27/0248; H01L 27/0255; H02H 9/046
See application file for complete search history.

(56) References Cited

U.S. PATENT DOCUMENTS

| 8,054,710 B2 | 11/2011 | Ito et al. |
| 8,089,598 B2* | 1/2012 | Kim .................. G02F 1/136286 |
| | | 349/139 |
| 8,188,544 B2 | 5/2012 | Kumagai et al. |
| 8,310,478 B2 | 11/2012 | Kumagai et al. |
| 2009/0201053 A1 | 8/2009 | Chang |
| 2011/0128274 A1 | 6/2011 | Kumagai et al. |
| 2012/0019566 A1 | 1/2012 | Ito et al. |
| 2014/0117320 A1* | 5/2014 | Jung .................. H01L 27/3276 |
| | | 257/40 |

FOREIGN PATENT DOCUMENTS

| JP | 4010335 | 9/2007 |
| KR | 10-2010-0124036 A | 11/2010 |
| KR | 10-1043678 | 6/2011 |

* cited by examiner

*Primary Examiner* — Stephen W Jackson
*Assistant Examiner* — Christopher Clark
(74) *Attorney, Agent, or Firm* — Myers Bigel, P.A.

(57) ABSTRACT

A source driving integrated circuit is provided. The source driving integrated circuit includes a source driver area, an electrostatic discharge (ESD) circuit area and a fan-out area. The source driver area includes a plurality of source driver units. The ESD circuit area includes a plurality of ESD units. The fan-out area includes conduction lines for electrically connecting respective ones of the source driver units of the source driver area to ones of the plurality of the ESD units of the ESD circuit area. In a horizontal structure of a semiconductor integrated circuit, the fan-out area at least partially overlaps the ESD circuit area.

20 Claims, 9 Drawing Sheets

SOURCE DRIVING INTEGRATED CIRCUITS INCLUDING AN ELECTROSTATIC DISCHARGE CIRCUIT AND RELATED LAYOUT METHOD

CROSS-REFERENCE TO RELATED APPLICATION

This application claims priority under 35 U.S.C. §119 to Korean Patent Application No. 10-2013-0037038 filed on Apr. 4, 2013, the disclosure of which is hereby incorporated by reference in its entirety.

FIELD

Embodiments of the inventive concept generally relate to semiconductor devices and, more particularly, to source driving integrated circuits of a display device and related layout method.

BACKGROUND

Liquid crystal display (LCD) devices are more popular than cathode ray tubes because they are thinner and lighter than cathode ray tubes and, thus, are widely used as an information processing apparatus.

Recently, various flat panel devices, such as the LCD, have been widely used as display devices. Flat panel devices generally include a display panel, a control unit, a gate driver and a source driver. The source driver is a circuit that drives a data line of the display panel using a voltage corresponding to a data signal received from the control unit. The source driver receives a plurality of gray voltages output from a gray voltage generating unit, and selects one of the plurality of gray voltages to drive the data line.

SUMMARY

Some embodiments of the present inventive concept provide a source driving integrated circuit including a source driver area, an electrostatic discharge (ESD) circuit area and a fan-out area. The source driver area includes a plurality of source driver units. The ESD circuit area includes a plurality of ESD units. The fan-out area includes conduction lines for electrically connecting ones of the source driver units of the source driver area to respective ones of the ESD units of the ESD circuit area. In a horizontal structure of a semiconductor integrated circuit, the fan-out area at least partially overlaps the ESD circuit area.

In further embodiments, in the horizontal structure of the semiconductor integrated circuit, the fan-out area may be included in the ESD circuit area.

In still further embodiments, a connection point may be provided between respective ones of the source driver units and the ESD units and may be positioned on a side of the ESD units adjacent to a front edge of the source driving integrated circuit.

In some embodiments, each of the plurality of ESD units may include a first diode including a first cathode and a first anode, the first cathode being electrically connected to a first node and the first anode being electrically connected to a ground; a second diode including a second anode and a second cathode, the second anode being electrically connected to the first node and the second cathode being electrically connected to a supply voltage; and a resistor coupled between the first node and the connection point. The resistor may be on the side of the ESD units adjacent to the front edge of the source driving integrated circuit.

In further embodiments, each of the plurality of ESD units may include a first diode including a first cathode and a first anode, the first cathode being electrically connected to a first node and the first anode being electrically connected to a ground; and a second diode including a second cathode and a second anode, the second anode being electrically connected to the first node and the second cathode being electrically connected to a supply voltage. The first node may be electrically connected to the connection point.

In still further embodiments, a connection point between respective ones of the source driver units and the ESD units may be at a center of each of the ESD units.

In further embodiments, a connection point between respective ones of the source driver units and the ESD units may be between a side of the ESD units adjacent to a front edge of the source driving integrated circuit and a center of each of the ESD units.

In some embodiments, an output pad area that at least partially overlaps the ESD circuit area is provided, in the horizontal structure of the semiconductor integrated circuit.

In further embodiments, output pads may be connected to corresponding ones of the ESD units.

In still further embodiments, a pitch of each of the ESD units may be greater than a pitch of each of the corresponding source driver units.

In some embodiments, the source driving integrated circuit may further include a logic circuit area and an analog circuit area.

Further embodiments of the present inventive concept provide a layout method of a source driving integrated circuit, the method including: forming a source driver area including a plurality of source driver units; forming an electrostatic discharge (ESD) circuit area including a plurality of ESD units, the ESD circuit area being separate from the source driver area, in a horizontal structure of a semiconductor integrated circuit; and forming a fan-out area including conduction lines electrically connecting ones of the source driver units of the source driver area to respective ones of the ESD units of the ESD circuit area. The fan-out area at least partially overlaps the ESD circuit area, in the horizontal structure of the semiconductor integrated circuit.

Still further embodiments of the present inventive concept provide a source driving integrated circuit including a fan-out area including connection lines configured to electrically connect a plurality of source driver units to respective ones of a plurality of electrostatic discharge (ESD) units. The fan-out area at least partially overlaps an ESD circuit area including the plurality of ESD units such that a length of a short side of the source driving integrated circuit is relatively decreased.

BRIEF DESCRIPTION OF THE DRAWINGS

The foregoing and other features and advantages of the inventive concept will be apparent from the more particular description of preferred embodiments of the inventive concept, as illustrated in the accompanying drawings in which like reference characters refer to the same parts throughout the different views. The drawings are not necessarily to scale, emphasis instead being placed upon illustrating the principles of the inventive concept. In the drawings.

DETAILED DESCRIPTION OF THE EMBODIMENTS

Figure 1:
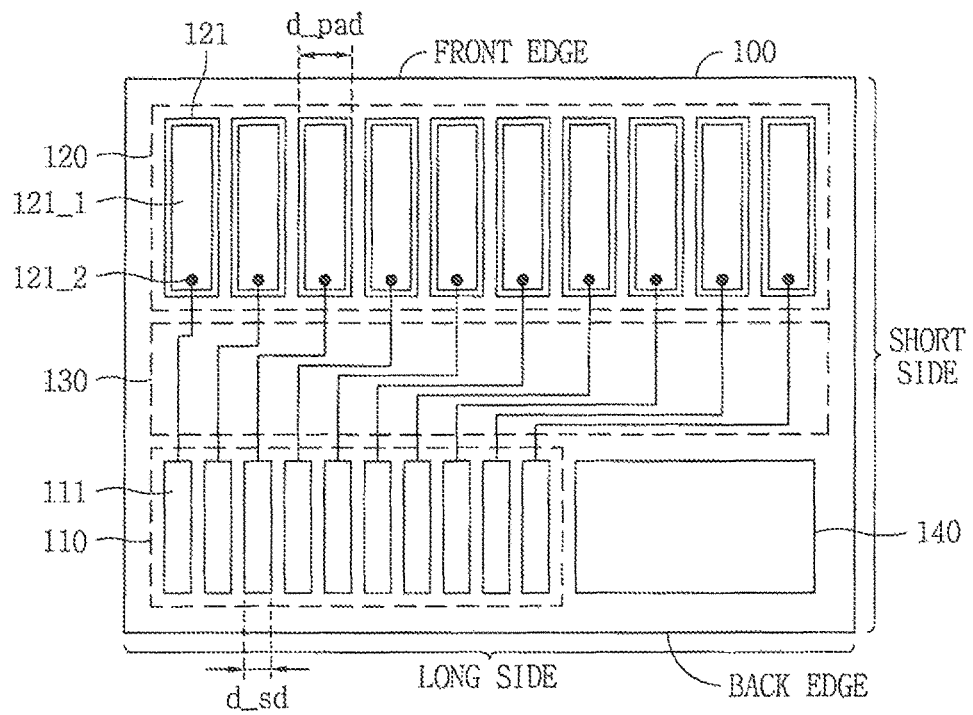
FIG. 1 is a layout diagram illustrating a conventional source driving integrated circuit.

Various embodiments will now be described more fully with reference to the accompanying drawings in which some embodiments are shown. These inventive concept may, however, be embodied in different forms and should not be construed as limited to the embodiments set forth herein. Rather, these embodiments are provided so that this disclosure is thorough and complete and fully conveys the inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As will be discussed further herein with respect to FIGS. 1 through 14, source driving integrated circuits in accordance with some embodiments of the present inventive concept the fan-out area includes conduction lines for electrically connecting ones of the source driver units of the source driver area of the source driving integrated circuit to respective ones of the ESD units of the ESD circuit area. The fan-out area at least partially overlaps the ESD circuit area, in a horizontal structure of a semiconductor integrated circuit. Thus, the source driving integrated circuit in accordance with some embodiments discussed herein may not need additional space for the fan-out area and, therefore, a length of the short side of the source driving integrated circuit may be decreased and the chip size of the source driving integrated circuit may be reduced.

Figure 2:
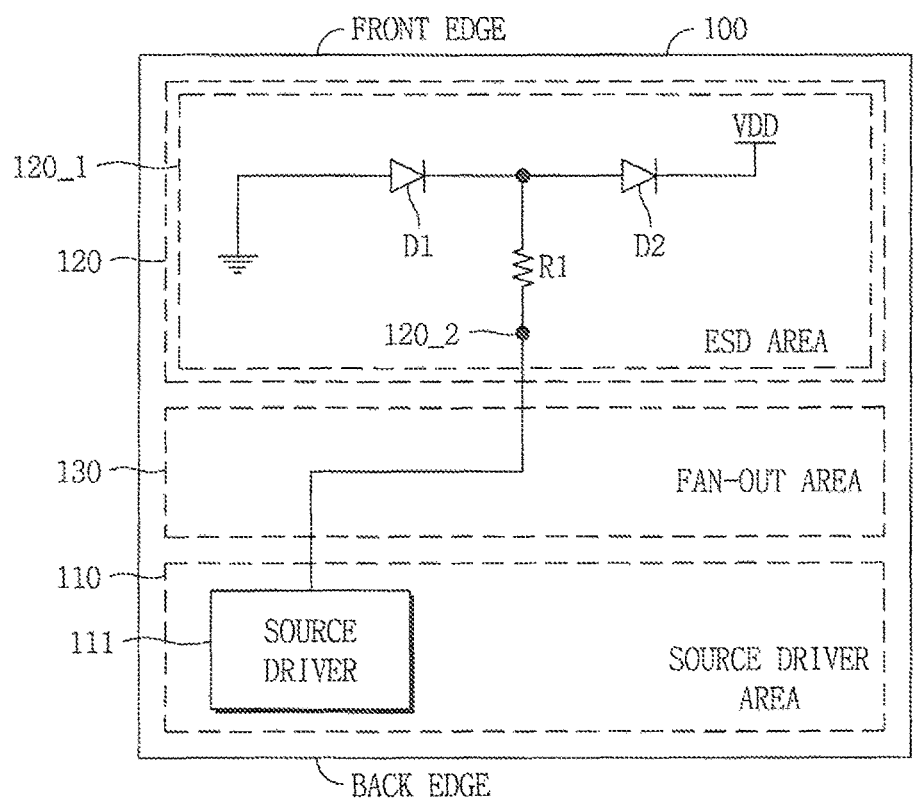
FIG. 2 is a diagram illustrating a portion of an electrostatic discharge (ESD) circuit in the source driving integrated circuit of FIG. 1.

FIG. 1 is a layout diagram illustrating a conventional source driving integrated circuit 100 and FIG. 2 is a diagram illustrating a portion of an electrostatic discharge (ESD) circuit in the source driving integrated circuit of FIG. 1.

Referring first to FIG. 1, the conventional source driving integrated circuit 100 includes a source driver area 110 including a plurality of source driver units 111, an electrostatic discharge (ESD) circuit area 120 including a plurality of ESD units 121_1, and a fan-out area 130. Each of the plurality of ESD units 121_1 is formed to be overlapped with each of a plurality of output pads 121, respectively. In a horizontal structure of a semiconductor integrated circuit, the fan-out area 130 is separated from the source driver area 110 and the ESD circuit area 120 and disposed between the source driver area 110 and the ESD circuit area 120. The fan-out area 130 includes conduction lines for electrically connecting each of the source driver units 111 of the source driver area 110 to each of the ESD units 121_1 of the ESD circuit area 120. Furthermore, the source driving integrated circuit 100 may include a logic circuit and analog circuit 140.

As the resolution of a display device increases, a pitch of the source driver units 111, the ESD units 121_1 and the output pads 121 is reduced. The pitch of the source driver units 111 may be easily reduced, but there is a limit to how much the pitch of the output pads 121 can be reduced. As illustrated in FIG. 1, the pitch d_pad of the output pads 121 is larger than the pitch d_sd of the source driver units 111. Therefore, a fan-out area 130 that the conduction lines for electrically connecting each of the source driver units 111 of the source driver area 110 to each of the ESD units 121_1 of the ESD circuit area 120 is needed. In conventional devices, as shown in FIG. 1, the fan-out area 130 is separated from the source driver area 110 and the ESD circuit area 120 and disposed between the source driver area 110 and the ESD circuit area 120. Furthermore, a connection point 121_2 at which each of the source driver units 111 is electrically connected to each of the ESD units 121_1 is disposed inside each of the ESD units 121_1 and on a side near to each of the source driver units 111. In other words, the connection point 121_2 was disposed on the side far from a front edge of the source driving integrated circuit 100.

Therefore, in conventional devices, the length of a short side of the source driving integrated circuit 100 may be increased. The source driving integrated circuit 100 has a feature that the length of a long side cannot be easily reduced. Therefore, the length of a short side of the source driving integrated circuit 100 must be reduced to reduce a chip size.

As illustrated in FIG. 2, an ESD circuit 120_1 is disposed in the ESD circuit area 120. Although only one ESD circuit 120_1 is illustrated in FIG. 2, the ESD circuit 120_1 may be formed in each of the ESD units 121_1. The ESD circuit 120_1 may include diodes D1 and D2 and a resistor R1. The resistor R1 and the source driver units 111 may be electrically connected at the connection point 120_2.

Figure 3:
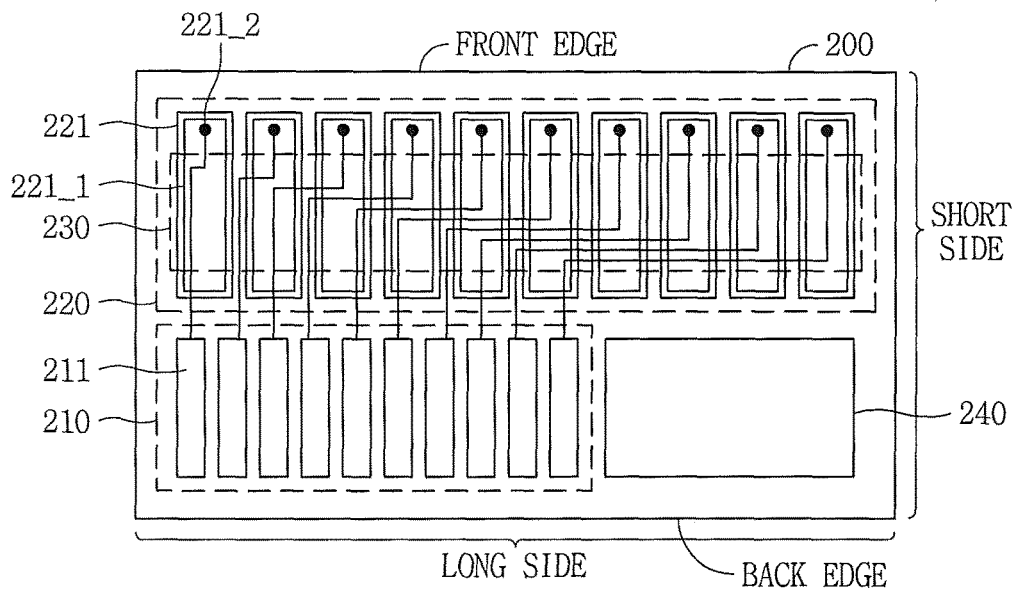
FIG. 3 is a layout diagram illustrating a source driving integrated circuit in accordance with some embodiments of the inventive concept.
Figure 4:
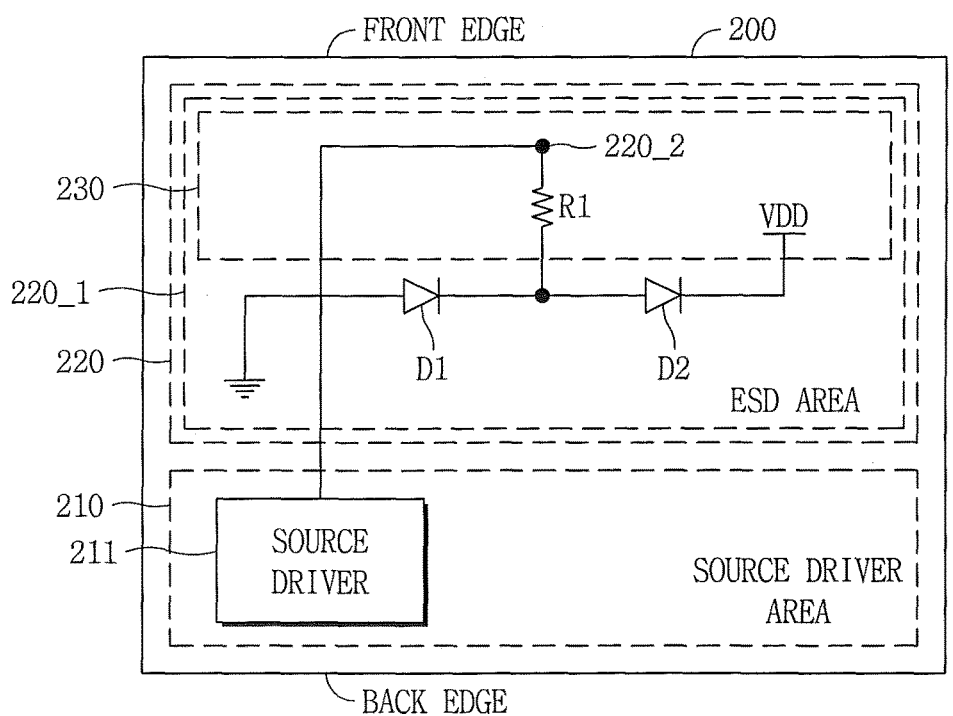
FIG. 4 is a diagram illustrating a portion of an ESD circuit included in the source driving integrated circuit of FIG. 3.

FIG. 3 is a layout diagram illustrating a source driving integrated circuit, in accordance with some embodiments of the inventive concept. FIG. 4 is a diagram illustrating an example of a portion of an ESD circuit included in the source driving integrated circuit of FIG. 3.

As illustrated in FIG. 3, the source driving integrated circuit 200 may include a source driver area 210 including a plurality of source driver units 211, an electrostatic discharge (ESD) circuit area 220 including a plurality of ESD units 221_1, and a fan-out area 230. Each of the plurality of ESD units 221_1 may be formed to be overlapped with each of a plurality of output pads 221, respectively. In a horizontal structure of a semiconductor integrated circuit, the fan-out area 230 may be separated from the source driver area 210 and overlapped with the ESD circuit area 220. In a horizontal structure of a semiconductor integrated circuit, the fan-out area 230 may be included in the ESD circuit area 220.

The fan-out area 230 may include conduction lines for electrically connecting each of the source driver units 211 of the source driver area 210 to each of the ESD units 221_1 of the ESD circuit area 220. Furthermore, the source driving integrated circuit 200 may include an area 240 in which a logic circuit and an analog circuit is included.

Referring now to FIG. 4, an ESD circuit 220_1 may be disposed in the ESD circuit area 220. It will be understood that the ESD circuit 220_1 may be formed in each of the ESD units 221_1, but a single ESD circuit 220_1 is illustrated in FIG. 4 for convenience of explanation. The ESD circuit 220_1 may include a first diode D1, a second diode D2, and a resistor R1. The first diode D1 is called an N-type diode and the second diode D2 is called a P-type diode.

The first diode D1 may have a cathode electrically connected to a first node and an anode electrically connected to a ground. The second diode D2 may have an anode electrically connected to the first node and a cathode electrically connected to a supply voltage. The resistor R1 may be connected between the first node and the connection point 220_2. The resistor R1 and the source driver units 211 may be electrically connected at the connection point 220_2. The connection point 220_2 may be disposed at a side of the ESD units 221_1 adjacent to a front edge of the source driving integrated circuit 200.

In the source driving integrated circuit 200 according embodiments illustrated in FIG. 3, the connection point at which each of the source driver units 211 is electrically connected to each of the ESD units 221_1 may be disposed at a side of the ESD units 221_1 inside of each of the ESD units 221_1, far from the source driver units 211, and adjacent to a front edge of the source driving integrated circuit 200, in the horizontal structure of a semiconductor integrated circuit.

Therefore, the fan-out area 230 including conduction lines for electrically connecting each of the source driver units 211 of the source driver area 210 to each of the ESD units 221_1 of the ESD circuit area 220 may be formed to be overlapped with the ESD circuit area 220, in the horizontal structure of a semiconductor integrated circuit.

Unlike conventional source driving integrated circuits 100, the source driving integrated circuit 200 in accordance with embodiments discussed herein may not need to have an additional space for the fan-out area 230 including conduction lines for electrically connecting each of the source driver units 211 of the source driver area 210 to each of the ESD units 221_1 of the ESD circuit area 220. Therefore, the source driving integrated circuit 200 according to some embodiments of the inventive concept may decrease the length of the short side. As discussed above, the source driving integrated circuit that drives a display device has the feature that the length of a long side cannot be easily reduced. Therefore, the chip size of the source driving integrated circuit 200 may be reduced because the length of the short side is decreased.

Figure 5:
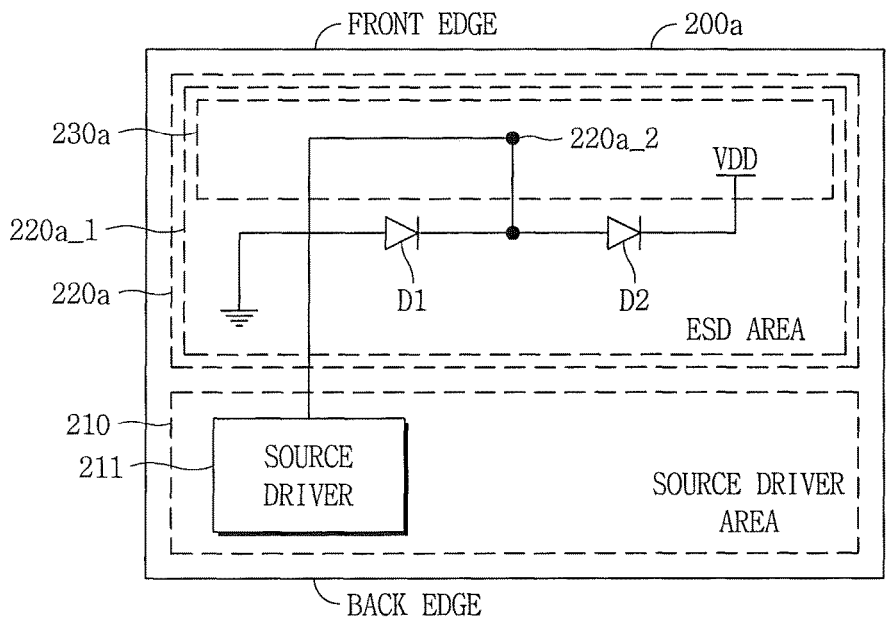
FIG. 5 is a diagram illustrating a portion of an ESD circuit included in the source driving integrated circuit of FIG. 3.

Referring now to FIG. 5, a diagram illustrating a portion of an ESD circuit included in the source driving integrated circuit of FIG. 3 in accordance with some embodiments of the present inventive concept will be discussed. As illustrated in FIG. 5, the source driving integrated circuit 200a may include a source driver area 210 including a plurality of source driver units 211, an electrostatic discharge (ESD) circuit area 220a, and a fan-out area 230a. An ESD circuit 220a_1 may be disposed in the ESD circuit area 220a. It will be understood that the ESD circuit 220a_1 may be formed in each of the ESD units 221_1, but a single ESD circuit 220a 1 is illustrated in Figure for convenience of explanation. The ESD circuit 220a_1 may include a first diode D1 and a second diode D2.

The first diode D1 may have a cathode electrically connected to a first node and an anode electrically connected to a ground. The second diode D2 may have an anode electrically connected to the first node and a cathode electrically connected to a supply voltage. Unlike the source driving integrated circuit 200 of FIG. 4, the source driving integrated circuit 200a may not include a resistor R1, and the connection point 220a_2 may be connected to the first node. The connection point 220a_2 may be disposed at a side of the ESD circuit 220a_1 adjacent to a front edge of the source driving integrated circuit 200a.

Therefore, the fan-out area 230a may be separated from the source driver area 210, and may be overlap with the ESD circuit area 220a, in the horizontal structure of a semiconductor integrated circuit. The fan-out area 230a may be disposed in the ESD circuit area 220a, in the horizontal structure of a semiconductor integrated circuit.

Figure 6:
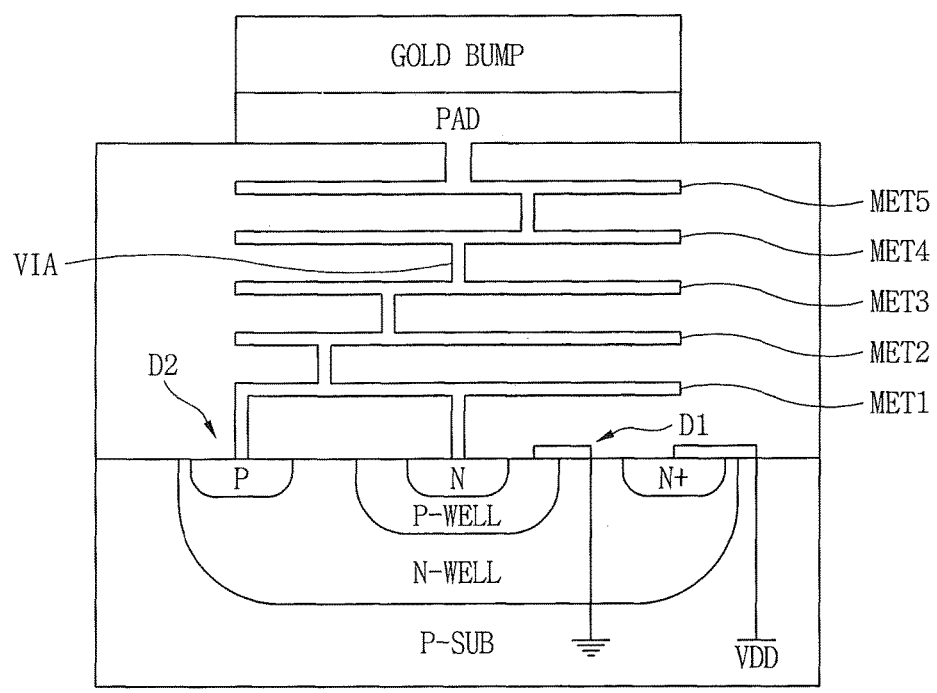
FIG. 6 is a cross-section illustrating a vertical structure of a portion of an ESD circuit included in the source driving integrated circuit of FIG. 3.

Referring now to FIG. 6, a cross-section illustrating a vertical structure of a portion of an ESD circuit included in the source driving integrated circuit 200 of FIG. 3 in accordance with some embodiments of the inventive concept will be discussed. As illustrated in FIG. 6, the method of fabricating the ESD circuit may include the following steps:

(1) forming an N-type well N-WELL in a P-type substrate P-SUB;
(2) forming a P-type well P-WELL in the N-type well N-WELL;
(3) forming an N-type area for an N-type diode D1 in the P-type well P-WELL;
(4) forming a P-type area for a P-type diode D2 in the N-type well N-WELL;
(5) forming a N+-type area for a contact in the N-type well N-WELL;
(6) sequentially forming a via VIA, a first metal layer MET1, a via, a second metal layer MET2, a via, a third metal layer MET3, a via, a fourth metal layer MET4, a via, a fifth metal layer MET5;
(7) forming a pad PAD after forming a PAD opening; and
(8) forming a gold bump on the pad PAD.

The N-type area may provide a cathode of the N-type diode D1 and the P-type area may provide an anode of the P-type diode D2. The N-type area and the P-type area may be electrically connected through the VIA and the first metal layer MET1. The P-type well P-WELL (anode of the N-type diode D1) may be connected to ground (GND), and the N+-type area (cathode of the P-type diode D2) may be connected to the supply voltage VDD. In the source driving integrated circuit 200 of FIG. 3, the conduction lines for electrically connecting each of the source driver units 211 of the source driver area 210 to each of the ESD units 221_1 of the ESD circuit area 220 may be implemented using a part of the metal layers MET1 to MET5. As discussed above, the conduction lines for electrically connecting each of the source driver units 211 of the source driver area 210 to each of the ESD units 221_1 of the ESD circuit area 220 may be disposed in the fan-out area 230 formed to be overlapped with the ESD circuit area 220, in the horizontal structure of a semiconductor integrated circuit.

Figure 7:
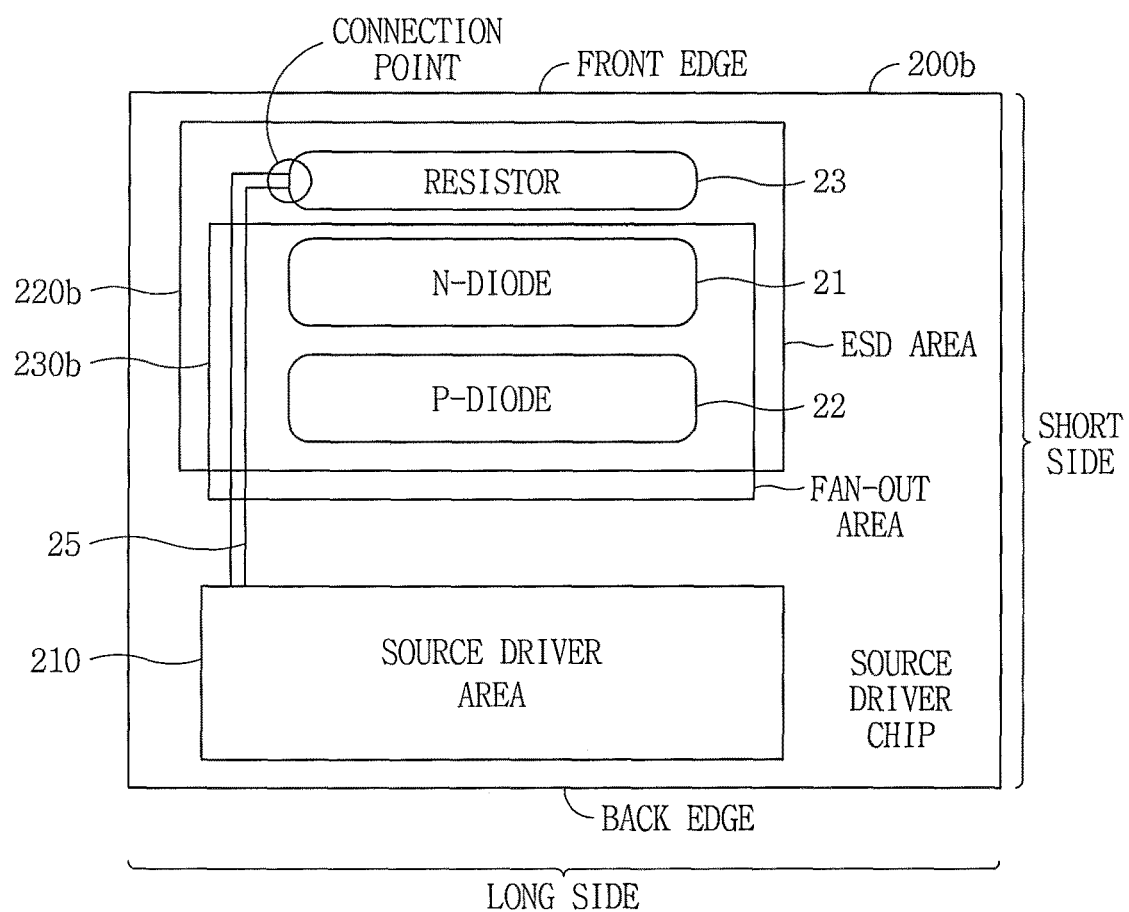
FIG. 7 is a layout diagram illustrating a source driving integrated circuit in accordance with some embodiments of the inventive concept.

FIG. 7 is a layout diagram illustrating a source driving integrated circuit in accordance with some embodiments of the inventive concept. As illustrated in FIG. 7, the source driving integrated circuit 200b may include a source driver area 210, an electrostatic discharge (ESD) circuit area 220b, and a fan-out area 230b. An ESD circuit including a resistor 23, an N-type diode 21 and a P-type diode 22 may be disposed in the ESD circuit area 220b. The resistor 23 may be connected to the source driver area 210 through a conduction line 25. It will be understood that the ESD circuit may be formed in each of the ESD units included in the ESD circuit area 220b, but one ESD circuit is illustrated in FIG. 7 for convenience of explanation.

The connection point at which the resistor 23 and the source driver area 210 are electrically connected may be disposed at a side of the ESD units adjacent to a front edge of the source driving integrated circuit 200b. Further, the resistor 23 may be disposed in the ESD circuit area 220b and the one side of the ESD units adjacent to the front edge of the source driving integrated circuit 200b. Therefore, the fan-out area 230b may be separated from the source driver area 210, and overlap the ESD circuit area 220b, in the horizontal structure of a semiconductor integrated circuit. The fan-out area 230b may be disposed in the ESD circuit area 220a, in the horizontal structure of a semiconductor integrated circuit.

Figure 8:
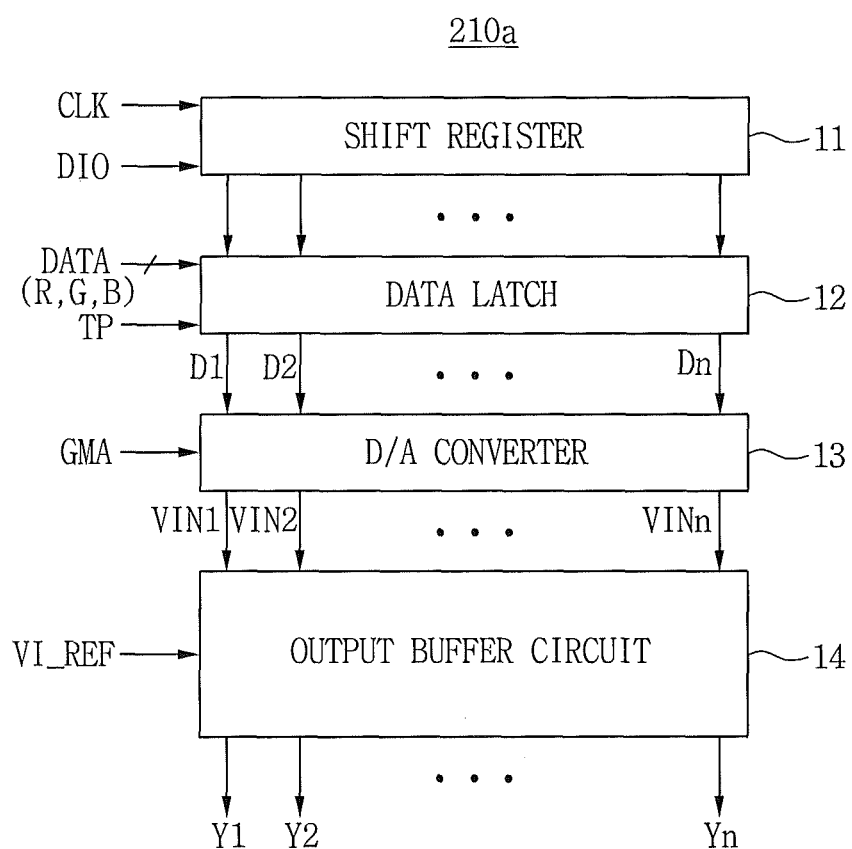
FIG. 8 is a circuit diagram illustrating some embodiments of a source driving integrated circuit that may be included in a source driving circuit area of FIG. 3.

Referring now to FIG. 8, a circuit diagram illustrating some embodiments of a source driving integrated circuit that may be included in the source driver area 210 of FIG. 3 will be discussed. As illustrated in FIG. 8, the source driving circuit 210a may include a shift register 11, a data latch circuit 12, a digital-to-analog converter 13, and an output buffer circuit 14.

The shift register 11 may generate a pulse signal based on a clock signal CLK and an input/output control signal DIO. The data latch circuit 12 may receive data DATA and a load signal TP. The data latch circuit 12 may latch data DATA according to a shift sequence of the shift register 11 and output the data DATA when the load signal TP is applied.

The digital-to-analog converter 13 may generate input voltage signals VIN1 to VINn, which are analog signals, corresponding to output signals D1 to Dn of the data latch circuit 12 using a gray voltage GMA. The output buffer circuit 14 may generate a bias current control signal VCON_IB based on an input signal VI_REF to compensate a slew rate, and buffer the input voltage signals VIN1 to VINn to generate source signals Y1 to Yn. The source signals Y1 to Yn may be output to each source line according to a sequence of data DATA applied to the data latch circuit 12.

The source signals Y1 to Yn may be output through the source driver units 211 included in the source driver area 210 in FIG. 3.

Figure 9:
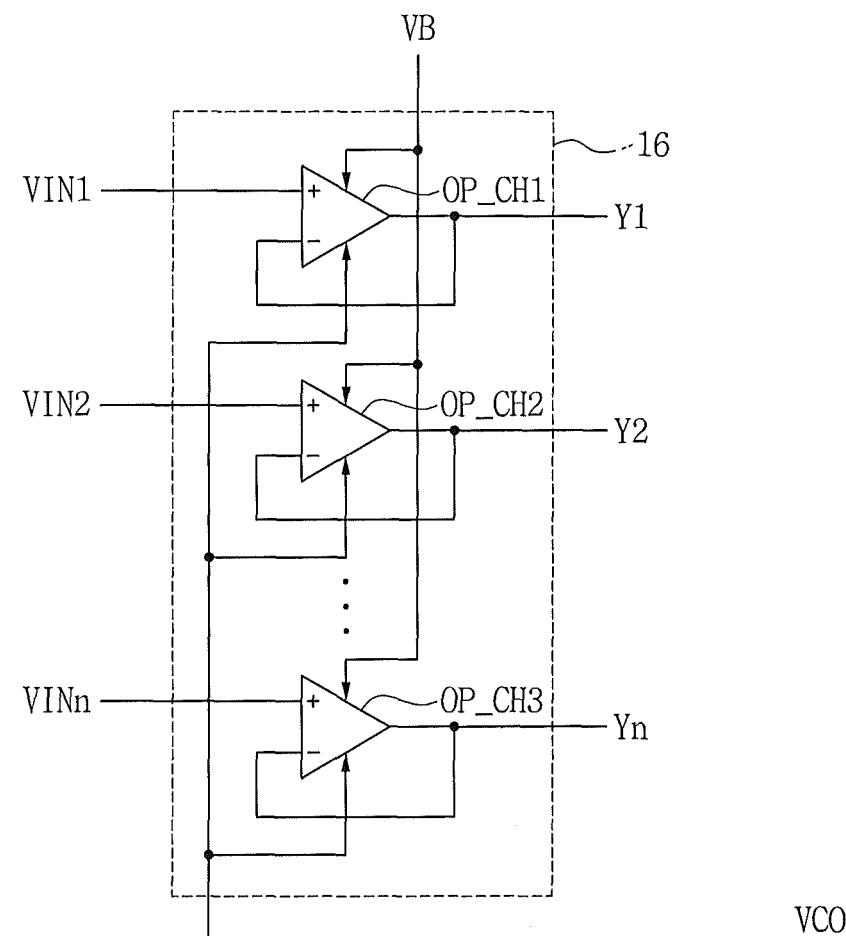
FIG. 9 is a circuit diagram illustrating some embodiments of an output buffer circuit included in the source driving circuit of FIG. 8.

Referring now to FIG. 9, a circuit diagram illustrating some embodiments of an output buffer circuit 14 included in the source driving circuit 210a of FIG. 8 will be discussed. As illustrated in FIG. 9, the output buffer circuit 14 may include a bias current control signal generating circuit 15 and a channel amplifying circuit 16.

The bias current control signal generating circuit 15 may include a reference operational amplifier OP_REF_1, and perform an exclusive OR operation on an input signal VI_REF and an output signal VO_REF of the reference operational amplifier OP_REF_1 to generate a bias current control signal VCON_IB. The channel amplifying circuit 16 may compensate for a slew rate in response to the bias current control signal VCON_IB, and perform buffering on input voltage signals VIN1 to VINn to generate output voltage signals Y1 to Yn. The channel amplifying circuit 16 may include channel amplifiers OP_CH1, OP_CH2 and OP_CH3.

The bias current control signal generating circuit 15 may include a reference operational amplifier OP_REF_1 and an exclusive OR (XOR) circuit XOR1. The XOR circuit XOR1 may perform the exclusive OR operation on the input signal VI_REF and the output signal VO_REF of the reference operational amplifier OP_REF_1 to generate the bias current control signal VCON_IB.

The bias current control signal VCON_IB may be activated during a transition period in which the output signal of the reference operational amplifier OP_REF_1 changes from a minimum value to a half of a maximum value. The bias current control signal VCON_IB may be activated during a transition period in which the output signal of the reference operational amplifier OP_REF_1 changes from a ground voltage to a half of a supply voltage.

Figure 10:
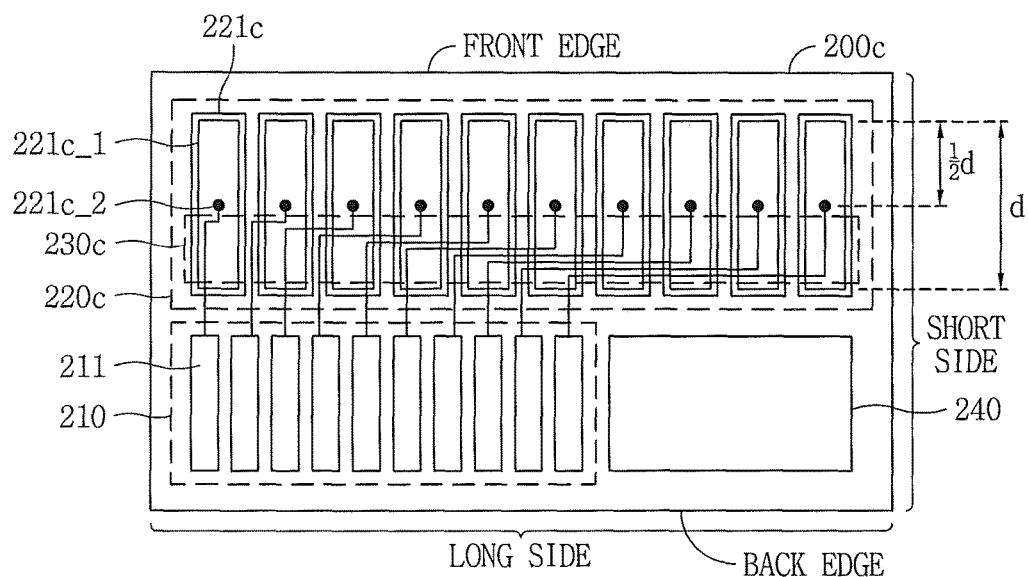
FIG. 10 is a layout diagram illustrating a source driving integrated circuit in accordance with some embodiments of the inventive concept.

Referring now to FIG. 10, a layout diagram illustrating a source driving integrated circuit in accordance with some embodiments of the inventive concept will be discussed. As illustrated in FIG. 10, the source driving integrated circuit 200c may include a source driver area 210 including a plurality of source driver units 211, an electrostatic discharge (ESD) circuit area 220c including a plurality of ESD units 221c_1, and a fan-out area 230c. Each of the plurality of ESD units 221c_1 may overlap each of a plurality of output pads 221c, respectively. In a horizontal structure of a semiconductor integrated circuit, the fan-out area 230c may be separated from the source driver area 210 and overlapped with the ESD circuit area 220c. In a horizontal structure of a semiconductor integrated circuit, the fan-out area 230c may be included in the ESD circuit area 220c.

The fan-out area 230c may include conduction lines for electrically connecting each of the source driver units 211 of the source driver area 210 to each of the ESD units 221c_1 of the ESD circuit area 220c. Further, the source driving integrated circuit 200c may include an area 240 in which a logic circuit and an analog circuit is included.

In the source driving integrated circuit 200c illustrated in FIG. 10, the connection point 221c_2 at which each of the source driver units 211 is electrically connected to each of the ESD units 221c_1 may be disposed on a center of each of the ESD units 221c_1, in a horizontal structure of a semiconductor integrated circuit.

Therefore, the fan-out area 230c including conduction lines for electrically connecting each of the source driver units 211 of the source driver area 210 to each of the ESD units 221c_1 of the ESD circuit area 220c may be formed to be overlapped with the ESD circuit area 220c, in the horizontal structure of a semiconductor integrated circuit. The source driving integrated circuit 200c may not need to have an additional space for the fan-out area 230c including conduction lines for electrically connecting each of the source driver units 211 of the source driver area 210 to each of the ESD units 221c1 of the ESD circuit area 220c. Therefore, the source driving integrated circuit 200c according to some embodiments of the inventive concept may decrease the length of the short side. As discussed above, the source driving integrated circuit that drives a display device has the feature that the length of a long side cannot be easily reduced. Therefore, the chip size of the source driving integrated circuit 200c may be reduced because the length of the short side is decreased.

Figure 11:
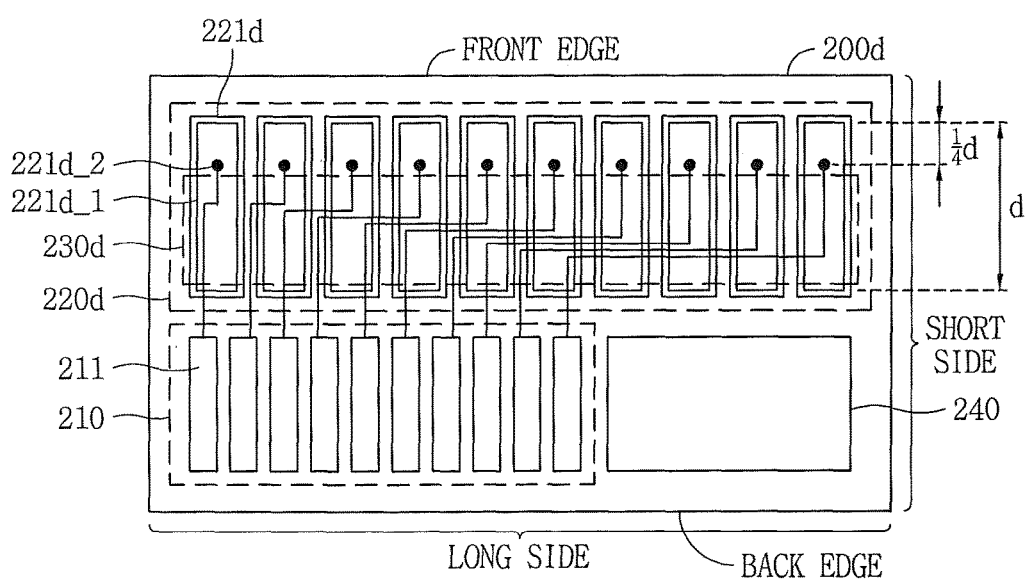
FIG. 11 is a layout diagram illustrating a source driving integrated circuit in accordance with some embodiments of the inventive concept.

Referring now to FIG. 11, a layout diagram illustrating a source driving integrated circuit in accordance with some embodiments of the inventive concept will be discussed. As illustrated in FIG. 11, the source driving integrated circuit 200d may include a source driver area 210 including a plurality of source driver units 211, an electrostatic discharge (ESD) circuit area 220d including a plurality of ESD units 221d_1, and a fan-out area 230d. Each of the plurality of ESD units 221d_1 may overlap each of a plurality of output pads 221d, respectively. In a horizontal structure of a semiconductor integrated circuit, the fan-out area 230d may be separated from the source driver area 210 and overlapped with the ESD circuit area 220d. In a horizontal structure of a semiconductor integrated circuit, the fan-out area 230d may be included in the ESD circuit area 220d.

The fan-out area 230d may include conduction lines for electrically connecting each of the source driver units 211 of the source driver area 210 to each of the ESD units 221d_1 of the ESD circuit area 220d. Further, the source driving integrated circuit 200d may include an area 240 in which a logic circuit and an analog circuit is included.

In the source driving integrated circuit 200d illustrated in FIG. 11, the connection point 221d2 at which each of the source driver units 211 is electrically connected to each of the ESD units 221d_1 may be disposed at a position corresponding to one fourth d/4 of a total length d of each of the ESD unit 221d_1 from a side of each of the ESD units 221d_1 adjacent to a front edge of the source driving integrated circuit.

Therefore, the fan-out area 230d including conduction lines for electrically connecting each of the source driver units 211 of the source driver area 210 to each of the ESD units 221d_1 of the ESD circuit area 220d may be formed to be overlapped with the ESD circuit area 220d, in the horizontal structure of a semiconductor integrated circuit. The source driving integrated circuit 200d may not need to have an additional space for the fan-out area 230d including conduction lines for electrically connecting each of the source driver units 211 of the source driver area 210 to each of the ESD units 221d1 of the ESD circuit area 220d. Therefore, the source driving integrated circuit 200d according to some embodiments of the inventive concept may decrease the length of the short side. As discussed above, the source driving integrated circuit that drives a display device has the feature that the length of a long side cannot be easily reduced. Therefore, the chip size of the source driving integrated circuit 200d may be reduced because the length of the short side is decreased.

The connection point 221d2 may be disposed in each of the ESD units 221d1, and near the front edge of the source driving integrated circuit 200d so that the fan-out area 230d may be firmed to be with the ESD circuit area 220d, in the horizontal structure of a semiconductor integrated circuit. The connection point 221d_2 may be disposed between a side of the ESD units 221d_1 adjacent to a front edge of the source driving integrated circuit and a center of each of the ESD units 221d_1.

Figure 12:
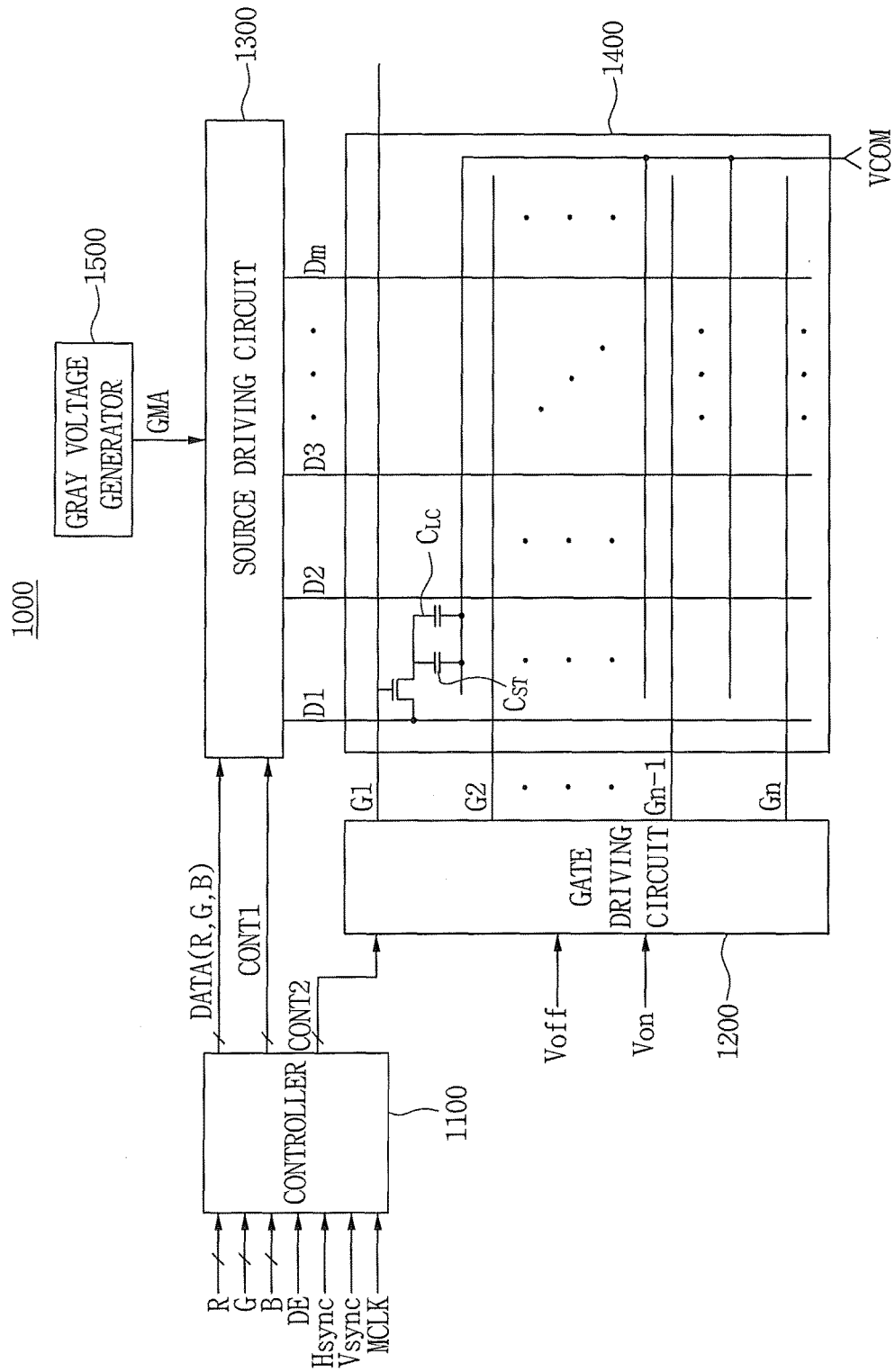
FIG. 12 is a circuit diagram illustrating an LCD device that includes a source driving circuit according to some embodiments of the inventive concept.

Referring now to FIG. 12, a circuit diagram illustrating an LCD device that includes the source driving circuit according to some embodiments of the inventive concept will be discussed. As illustrated in FIG. 12, the LCD device 1000 may include a controller 1100, a gate driving circuit 1200, a source driving circuit 1300, a liquid crystal panel 1400, and a gray voltage generator 1500.

The liquid crystal panel 1400 may include Thin Film Transistors (TFTs) located at each intersection of the matrix. The TFT may have a source receiving a source signal (also called a "data signal") and a gate receiving a gate signal (also called a "scan signal"). A storage capacitor CST and a liquid crystal capacitor CLC may be connected between a drain of the TFT and a common voltage VCOM. The liquid crystal panel 1400 may receive the gate signals through gate lines G1 to Gn, and the source signals through source lines D1 to Dm, respectively. The gate driving circuit 1200 may produce the gate signals by combining an on-voltage Von and an off-voltage Voff, and apply the gate signals to the gate lines G1 to Gn.

The gray voltage generator 1500 may generate positive and negative gray scale voltages GMA associated with the brightness of the LCD device 1000.

The source driving circuit 1300 may perform a digital-to-analog (D/A) conversion on data DATA received from the controller 1100 by using the gray scale voltages GMA output from the gray voltage generator 1500, and apply the converted data to the source lines D1 to Dm.

The controller 1100 may receive RGB video signals R, G and B and control signals, such as a vertical sync signal Vsync, a horizontal sync signal Hsync, a main clock signal MCLK, a data enable signal DE, and so on. The controller 1100 may generate source control signals CONT1 and gate control signals CONT2 based on the control signals, and properly process the RGB video signals R, G and B so as to meet operation conditions of the liquid crystal panel 1400. Then, the controller 1100 may transmit the gate control signals CONT2 to the gate driving circuit 1200, and transmit the source control signals CONT1 and the video signals DATA (R, G, B) to the source driving circuit 1300.

The gate driving circuit 1200 and the source driving circuit 1300 may include a plurality of gate drive integrated circuits (IC) (not shown) and a plurality of source drive ICs (not shown), respectively. The data DATA may determine a gray level with respect to each pixel. The source driving circuit 1300 may apply the source signals to the source lines arranged on the liquid crystal panel 1400, and the gate driving circuit 1200 may apply the gate signals to the gate lines arranged on the liquid crystal panel 1400.

The source driving circuit 1300 included in the LCD device 1000 of FIG. 12 may have a layout structure and circuit structure of the source driving integrated circuit similar to those illustrated in and discussed with respect to FIGS. 3 through 11. Therefore, the fan-out area including conduction lines for electrically connecting each of the source driver units 211 of the source driver area of the source driving circuit 1300 to each of the ESD units of the ESD circuit area may overlap the ESD circuit area, in the horizontal structure of a semiconductor integrated circuit. Therefore, the source driving circuit 1300 of the LCD device 1000 of FIG. 12 may decrease the length of the short side. Therefore, the chip size of the source driving circuit 1300 may be reduced.

Figure 13:
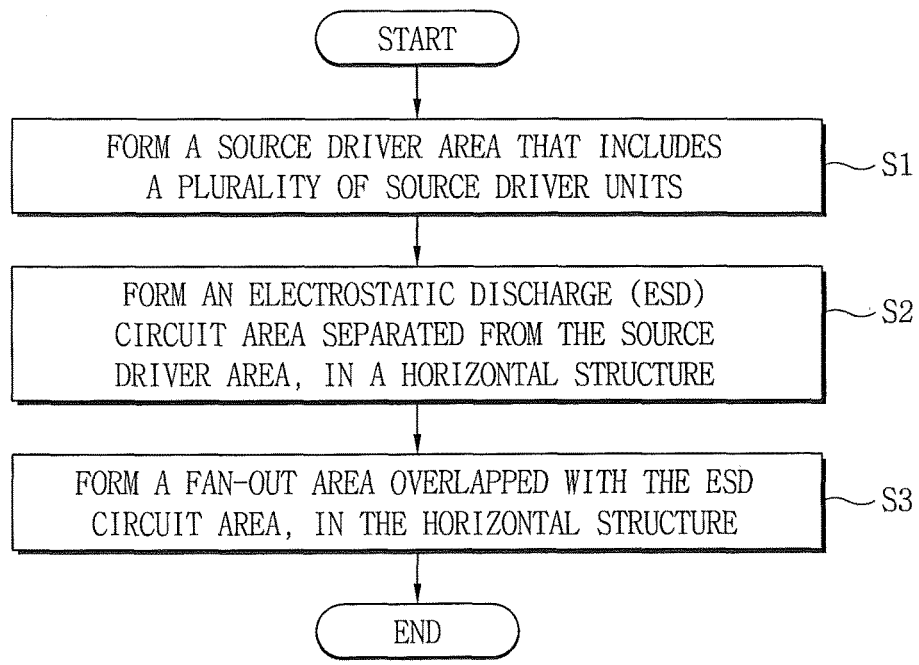
FIG. 13 is a flowchart illustrating a layout method of a source driving integrated circuit in accordance with some embodiments of the inventive concept.

Referring now to FIG. 13, a flowchart illustrating a layout method of a source driving integrated circuit in accordance with some embodiments of the inventive concept will be discussed. As illustrated in FIG. 13, the layout method of a source driving integrated circuit may include:

(1) forming a source driver area that includes a plurality of source driver units (S1);

(2) forming an electrostatic discharge (ESD) circuit area that includes a plurality of ESD units, the ESD circuit area being separated from the source driver area, in a horizontal structure of a semiconductor integrated circuit (S2);

(3) forming a fan-out area that includes conduction lines for electrically connecting each of the source driver units of the source driver area to each of the ESD units of the ESD circuit area, the fan-out area being overlapped with the ESD circuit area, in a horizontal structure of a semiconductor integrated circuit (S3).

Figure 14:
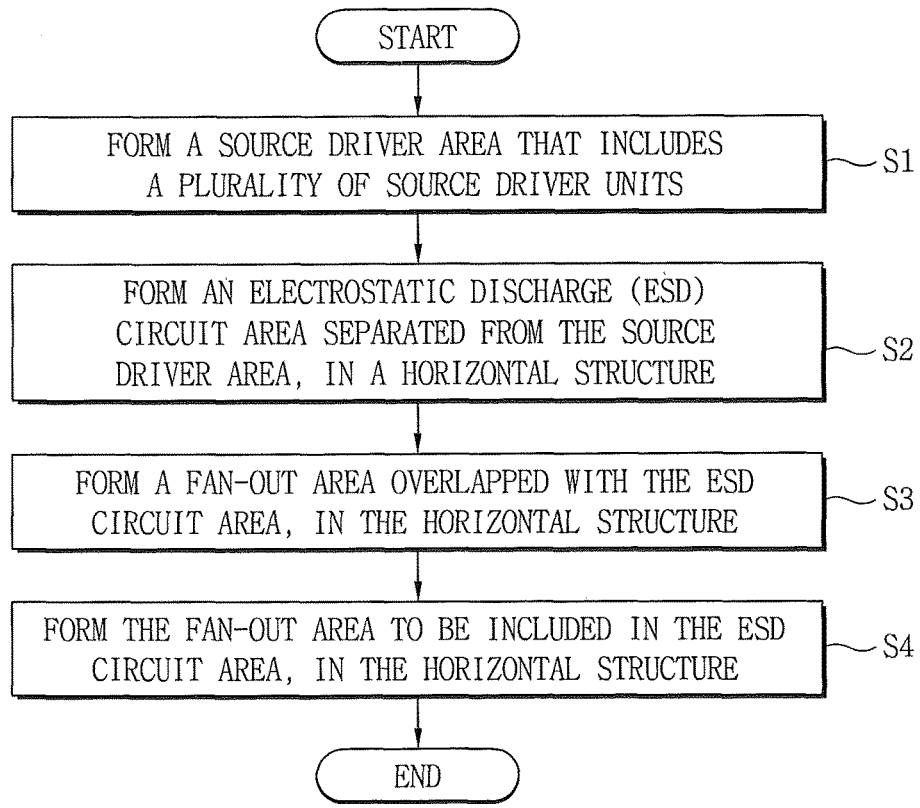
FIG. 14 is a flowchart illustrating a layout method of a source driving integrated circuit in accordance with some embodiments of the inventive concept.

FIG. 14 is a flowchart illustrating a layout method of a source driving integrated circuit, in accordance with another embodiment of the inventive concept.

Referring to FIG. 14, the layout method of a source driving integrated circuit may include the following steps:

(1) forming a source driver area that includes a plurality of source driver units (S1);

(2) forming an electrostatic discharge (ESD) circuit area that includes a plurality of ESD units, the ESD circuit area being separated from the source driver area, in a horizontal structure of a semiconductor integrated circuit (S2);

(3) forming a fan-out area that includes conduction lines for electrically connecting each of the source driver units of the source driver area to each of the ESD units of the ESD circuit area, the fan-out area being overlapped with the ESD circuit area, in a horizontal structure of a semiconductor integrated circuit (S3);

(4) forming the fan-out area to be included in the ESD circuit area in the horizontal structure of a semiconductor integrated circuit (S4).

In embodiments using the layout method of a source driving integrated circuit of FIGS. 13 and/or 14, the fan-out area including conduction lines for electrically connecting each of the source driver units of the source driver area of the source driving integrated circuit to each of the ESD units of the ESD circuit area may be overlap the ESD circuit area, in the horizontal structure of a semiconductor integrated circuit. Therefore, the length of the short side of the source driving integrated circuit may be decreased. Therefore, the chip size of the source driving integrated circuit may be reduced.

Although an LCD device having the source driving integrated circuit is discussed herein, embodiments of the present inventive concept are not limited to this configuration. For example, the inventive concept may be applied to general display devices such as a plasma display panel (PDP), an organic light emitting diode (OLED) without departing from the scope of the present inventive concept.

The source driving integrated circuit according to some embodiments of the inventive concept may have a structure that the fan-out area including the connection lines for electrically connecting each of the source driver units of the source driving circuit area to each of the ESD units of the ESD circuit area overlaps ESD circuit area, in the horizontal structure of a semiconductor integrated circuit.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures.

What is claimed is:

1. A source driving integrated circuit, comprising:
a source driver area including a plurality of source driver units;
an electrostatic discharge (ESD) circuit area including a plurality of ESD units; and
a fan-out area including a plurality of conduction lines electrically connecting the plurality of source driver units of the source driver area to the plurality of ESD units in the ESD circuit area,
wherein, in a horizontal structure of the source driving integrated circuit, the fan-out area at least partially overlaps the ESD circuit area, and
wherein adjacent ones of the plurality of conduction lines are horizontally spaced apart from each other and do not overlap.

2. The circuit of claim 1, wherein, in the horizontal structure of the source driving integrated circuit, the fan-out area is included in the ESD circuit area.

3. The circuit of claim 1, wherein a connection point between one of the plurality of source driver units and one of the plurality of ESD units that is electrically connected to the one of the plurality of source driver units is positioned on a side of the one of the plurality of ESD units adjacent to a front edge of the source driving integrated circuit.

4. The circuit of claim 3, wherein the one of the plurality of ESD units comprises:
a first diode including a first cathode and a first anode, the first cathode being electrically connected to a first node and the first anode being electrically connected to a ground;
a second diode including a second anode and a second cathode, the second anode being electrically connected to the first node and the second cathode being electrically connected to a supply voltage; and
a resistor coupled between the first node and the connection point.

5. The circuit of claim 4, wherein the resistor is on the side of the one of the plurality of ESD units adjacent to the front edge of the source driving integrated circuit.

6. The circuit of claim 3, wherein the one of the plurality of ESD units comprises:
a first diode including a first cathode and a first anode, the first cathode being electrically connected to a first node and the first anode being electrically connected to a ground; and
a second diode including a second cathode and a second anode, the second anode being electrically connected to the first node and the second cathode being electrically connected to a supply voltage,
wherein the first node is electrically connected to the connection point.

7. The circuit of claim 1, wherein a connection point between one of the plurality of source driver units and one of the plurality of ESD units that is electrically connected to the one of the plurality of source driver units is at a center of the one of the plurality of ESD units.

8. The circuit of claim 1, wherein a connection point between one of the plurality of source driver units and one of the plurality of ESD units is between a side of the one of the plurality of ESD units adjacent to a front edge of the source driving integrated circuit and a center of the one of the plurality of ESD units.

9. The circuit of claim 1, further comprising an output pad area that at least partially overlaps the ESD circuit area, in the horizontal structure of the source driving integrated circuit.

10. A layout method of a source driving integrated circuit, the method comprising:
forming a source driver area including a plurality of source driver units;
forming an electrostatic discharge (ESD) circuit area including a plurality of ESD units, the ESD circuit area being separate from the source driver area, in a horizontal structure of the source driving integrated circuit; and
forming a fan-out area including a plurality of conduction lines electrically connecting the plurality of source driver units of the source driver area to the plurality of ESD units of the ESD circuit area,
wherein the fan-out area at least partially overlaps the ESD circuit area, in the horizontal structure of the source driving integrated circuit, and
wherein adjacent ones of the plurality of conduction lines are horizontally spaced apart from each other and do not overlap.

11. The method of claim 10, wherein forming of the fan-out area comprises forming the ESD circuit area in the fan-out area, in the horizontal structure of the source driving integrated circuit.

12. The method of claim 10, further comprising forming an output pad area at least partially overlapping the ESD circuit area, in the horizontal structure of the source driving integrated circuit.

13. A source driving integrated circuit, comprising:
a source driver area including a plurality of source driver units;
an electrostatic discharge (ESD) circuit area including a plurality of ESD units; and
a fan-out area including a plurality of connection lines electrically connecting the plurality of source driver units to the plurality of electrostatic discharge (ESD) units,
wherein both the ESD circuit area and the fan-out area are spaced apart from the source driver area in a first horizontal direction and are included in an area, and
wherein the ESD circuit area has a first width in the first horizontal direction, the fan-out area has a second width in the first horizontal direction, and the area has a third width in the first horizontal direction that is less than a sum of the first width and the second width.

14. The circuit of claim 13, wherein a connection point between one of the plurality of source driver units and one of the plurality of ESD units that is electrically connected to the one of the plurality of source driver units is positioned on a side of the one of the plurality of ESD units adjacent to a front edge of the source driving integrated circuit or at a center of the one of the plurality of ESD units.

15. The circuit of claim 13, wherein the third width of the area including both the ESD circuit area and the fan-out area is equal to the first width of the ESD circuit area.

16. The circuit of claim 15, wherein the first width of the ESD circuit area is greater than the second width of the fan-out area.

17. The circuit of claim 13, wherein the fan-out area overlaps the ESD circuit area.

18. The circuit of claim 1, wherein one of the plurality of ESD units comprises a diode in a substrate of the source driving integrated circuit, and wherein one of the plurality of conduction lines that electrically connects the one of the plurality of ESD units to a corresponding one of the plurality of source driver units overlaps the diode of the one of the plurality of ESD units.

19. The circuit of claim 1, wherein both the ESD circuit area and the fan-out area are included in an area that is spaced apart from the source driver area in a first horizontal direction,
wherein the ESD circuit area has a first width in the first horizontal direction, the fan-out area has a second width in the first horizontal direction, and the area has a third width in the first horizontal direction that is less than a sum of the first width and the second width.

20. The circuit of claim 19, wherein the third width of the area including both the ESD circuit area and the fan-out area is equal to the first width of the ESD circuit area.

* * * * *